United States Patent [19]
Noro et al.

[11] Patent Number: 5,419,711
[45] Date of Patent: May 30, 1995

[54] CONNECTOR INSPECTING APPARATUS

[75] Inventors: Michimasa Noro; Takao Ito, both of Matsuzaka; Shigeo Sato, Kuwana, all of Japan

[73] Assignee: Sumitomo Wiring Systems, Ltd., Japan

[21] Appl. No.: 115,035

[22] Filed: Sep. 1, 1993

[30] Foreign Application Priority Data

Sep. 7, 1992 [JP] Japan .................................. 4-238553

[51] Int. Cl.⁶ .......................................... H01R 13/62
[52] U.S. Cl. ..................................... 439/310; 439/259; 324/158.1
[58] Field of Search ............... 439/310, 296, 259, 261, 439/342, 372, 482, 912; 324/158 F, 538

[56] References Cited

U.S. PATENT DOCUMENTS

| | | | |
|---|---|---|---|
| 3,111,355 | 11/1963 | Sambaroff et al. | 439/310 |
| 4,230,985 | 10/1980 | Matrone et al. | 439/310 |
| 4,820,183 | 4/1989 | Knapp et al. | 439/310 |
| 4,902,968 | 2/1990 | Sugimoto | 324/158 F |

FOREIGN PATENT DOCUMENTS

| | | |
|---|---|---|
| 53-18545 | 5/1978 | Japan . |
| 2169153 | 7/1986 | United Kingdom . |
| 2266629 | 11/1993 | United Kingdom . |

*Primary Examiner*—Larry I. Schwartz
*Assistant Examiner*—Hien D. Vu
*Attorney, Agent, or Firm*—Beveridge, DeGrandi, Weilacher & Young

[57] ABSTRACT

A connector inspecting apparatus includes (i) a connector receiving portion for holding a connector which is to be inspected and which has a terminal and (ii) an inspecting portion having a detecting piece corresponding to the terminal. The inspecting apparatus is arranged for inspecting the connector by moving the connector receiving portion and the inspecting portion toward and away from each other. One of the connector receiving portion and the inspecting portion is rotatably attached to a base. The other of the receiving portion and the inspecting portion is so guided as to be moved toward and away from the rotatably attached portion. When either of the receiving or inspecting portion is rotated, such rotational movement is converted into a sliding movement of the other portion. Accordingly, by rotating one of the portions, the connector can be inspected. This not only reduces the space required for installing the connector inspecting apparatus, but also facilitates the inspection operation.

8 Claims, 10 Drawing Sheets

CONNECTOR INSPECTING APPARATUS

BACKGROUND OF THE INVENTION

1. Field of the Invention

The present invention relates to connector inspecting apparatus for inspecting the mounting condition or the like of terminals of connectors which are used for connecting wire harnesses to one another or electric devices to one another, such wire harnesses and electric devices being used in a motor vehicle or the like.

2. Description of the Related Art

In a motor vehicle, wire harnesses are used for wiring electric components, and connectors are used for connecting such wire harnesses to one another and for connecting such wire harnesses to the electric components. Each of the connectors generally has a housing made of a synthetic resin material, and female terminals or male terminals attached into terminal housing chambers formed in the housing. A connector in which female terminals are mounted on the housing, is called a female connector, while a connector in which male terminals are mounted on the housing, is called a male connector. When the housing of a female connector is fitted to the housing of a male connector, the male and female terminals to be mutually connected to each other are positionally aligned and connected to each other, thus providing an electric connection therebetween.

For example, if there has been a failure to mount terminals, if the mounting positions of terminals on a housing have been improper or if terminals have been imperfectly crimped on electric wires, the electric components of a motor vehicle cannot be satisfactorily operated. It is therefore required to sufficiently inspect, at the final step of producing a wire harness, whether or not the terminals are accurately and securely mounted on the housing.

FIG. 9 shows the arrangement of a connector inspecting apparatus conventionally used for inspecting the mounting condition of terminals, and FIG. 10 shows how such a conventional connector inspecting apparatus is used.

A plurality of connector inspecting apparatus are fixed, as properly arranged, to an inspection drawing plate 2 on which is mounted a wire harness 1 in which a plurality of coated electric wires are assembled as bundled. On the surface of the inspection drawing plate 2, there is drawn a circuit for the wire harness 1 (which is not shown in FIG. 10). On the surface of the inspection drawing plate 2, the connector inspecting apparatus 10 are respectively disposed at positions corresponding to connectors 3 respectively attached to ends of the wire harness 1.

The connector inspecting apparatus 10 are connected to a conduction inspecting unit 5 through electric wires 6. The conduction inspecting unit 5 is adapted to carry out a conduction inspection based on circuit information relating to the wire harness 1 for checking whether or not the terminals have been securely mounted on the correct positions of the connectors.

As shown in FIG. 9, each of the connector inspecting apparatus 10 comprises a connector receiving portion 11 on which a connector 3 to be inspected is mounted, and an inspecting portion 13 having a plurality of detecting pieces 12 which are arranged side by side at positions respectively corresponding to a plurality of terminals (not shown) mounted on the connector 3. The connector receiving portion 11 is fixed to a base 14 to be fixed to the inspection drawing plate 2. A pair of rails 15 are formed at both lateral sides of the base 14. The inspecting portion 13 is slidably attached to the rails 15.

A lever attaching portion 16 stands from the base 14 at the end thereof opposite to the end thereof at which the connector receiving portion 11 is disposed. A lever 17 is rotatably attached to the lever attaching portion 16. A handle 18 is attached to the lever 17 which integrally has a cam portion 19 adapted to come in contact with the rear end surface of the inspecting portion 13.

For carrying out a conduction inspection, an inspection operator mounts a connector 3 to be inspected, on the connector receiving portion 11 and pulls and raises the lever 17 with the handle 18 held. This causes the cam portion 19 to push the rear end surface of the inspecting portion 13, thus causing the inspecting portion 13 to be slided toward the connector receiving portion 11. As a result, the terminals of the connector 3 come in contact with the detecting pieces 12 of the inspecting portion 13, thus electrically connecting the terminals to the detecting pieces 12.

If there has been a failure to mount the terminals or if the mounting positions of the terminals have been improper, the terminals will not be electrically connected to the detecting pieces 12, or the detecting pieces 12 and the terminals will not properly correspond to each other even though the terminals are electrically connected to the detecting pieces 12. In such a case, a display portion 5a of the conduction inspecting unit 5 displays the occurrence of abnormality. Thus, the inspection operator can be informed that the connector 3 of the wire harness 1 is defective. This prevents defective connectors from being distributed to the market.

FIG. 11 is a side view of the connector inspecting apparatus 10 above-mentioned for schematically illustrating the arrangement thereof. In this connector inspecting apparatus 10, when the lever 17 is rotated, the cam portion 19 pushes the inspecting portion 13, causing the inspecting portion 13 to be slided in directions shown by an arrow 20. In this connection, it is required to ensure, on the inspection drawing plate 2 (See FIG. 10), a sufficient space where the lever 17 can be rotated. Accordingly, it is required to provide, on the inspection drawing plate 2, a space of which length L1 is longer than the length of the base 14.

As another arrangement for sliding the inspecting portion 13, FIG. 12 shows a link-type drive mechanism. In FIG. 12, a lever 21 is rotatably attached to a lever attaching portion 16, and a link 22 is attached, at one end thereof, to the lever 21 at a position thereof which deviates from the axis of rotation of the lever 21. The other end of the link 22 is attached to an inspecting portion 13. According to this arrangement, too, when the lever 21 is rotated, the inspecting portion 13 can be slided in directions shown by an arrow 20.

In the arrangement in FIG. 12, it is required to ensure, on the inspection drawing plate 2, a space where the lever 21 can be rotated, likewise in the arrangement shown in FIG. 11. That is, there is required a space L2 of which the is longer than the length of a base 14.

Thus, each of the arrangements in FIGS. 11 and 12 disadvantageously requires a great space on the inspection drawing plate 2.

Generally, the wire harness to be disposed on the inspection drawing plate 2 is not so simple as shown in FIG. 10, but is often very complicated. Accordingly, when disposing a plurality of connector inspecting apparatus on the inspection drawing plate 2, the space available is very limited. It is therefore desired to reduce the space required for setting a connector inspecting apparatus.

Each of FIGS. 13 and 14 shows an example of a conventional connector inspecting apparatus of which the setting space is relatively small. In the connector inspecting apparatus in FIG. 13, a connector receiving portion 26 is fixed to a base 25 fixed to the drawing plate, and an inspecting portion 27 is so disposed as to be slidable as guided on the base 25 by guide rods 28.

For inspection, an inspecting operator mounts a connector 29 on the connector receiving portion 26, and slides the inspecting portion 27 toward the connector receiving portion 26 with the inspecting portion 27 directly held by his or her fingers.

In the connector inspecting apparatus in FIG. 14, an inspecting portion 31 is fixed to a base 30 and a connector receiving portion 32 is adapted to be slid as guided by guide rods 33. An inspection operator mounts a connector 34 on the connector receiving portion 32 and slides the connector receiving portion 32 as held directly by his or her fingers, toward the inspecting portion 31.

In each of the arrangements in FIGS. 13 and 14, since no lever is used, there is not required a setting space of which the length is longer than the length of the base 25 or 30. However, it is required to slide the inspecting portion 27 or the connector receiving portion 32 as held directly by fingers of the inspection operator. This requires a great force for inspection operation, causing the inspection efficiency to be inevitably lowered.

SUMMARY OF THE INVENTION

It is an object of the present invention to provide a connector inspecting apparatus which can overcome the technical problems above-mentioned.

More specifically, the present invention is proposed with the object of providing a connector inspecting apparatus of which setting space is small and with which inspection can be carried out with a simple operation.

A connector inspecting apparatus according to the present invention comprises: a base; a connector receiving portion for holding a connector to be inspected; and an inspecting portion disposed opposite to the connector receiving portion and having detecting pieces corresponding to a plurality of terminals of the connector to be inspected, the detecting pieces projecting toward the connector receiving portion. A first member serving as one of the connector receiving portion and the inspecting portion, is attached to the base in a manner rotatable around a predetermined axis. A second member serving as the other of the connector receiving portion and the inspecting portion, is guided such that the first and second members are movable toward and away from each other.

When the first member and/or the second member are rotated, such a rotational movement is converted into a sliding movement of the second member. Thus, by rotating the first member and/or the second member, the first member and the second member can be moved toward/away from each other.

The predetermined axis around which the first member and/or the second member are rotated, may be, for example, parallel with the plane on which the base is installed. In such a case, the rotation of the first member and/or the second member is effected along a plane at a right angle to the plane on which the base is installed.

Accordingly, when the first member and the second member are moved toward/away from each other, the second member is moved obliquely with respect to the plane on which the base is installed. In this connection, it is enough to ensure, on the plane on which the base is installed, a small space for installing the connector inspecting apparatus.

Thus, the connector inspecting apparatus of the present invention is arranged such that essential component elements thereof, i.e., the connector receiving portion and/or the inspecting portion, are rotated, and such a rotational movement is converted into a sliding movement of the connector receiving portion or the inspecting portion. This does not require an excessive space greater than the space that the inspecting portion and the connector receiving portion occupy. This enables a connector to be inspected with a less space.

Further, the connector receiving portion and the inspecting portion are not slided as directly held by fingers of an inspection operator. More specifically, by carrying out an operation of rotating the first member and/or the second member, the first member and the second member can be moved toward each other. Accordingly, the maneuverability is good and the inspection can be readily made.

These and other features, objects and advantages of the present invention will be more fully apparent from the following detailed description set forth below when taken in conjunction with the accompanying drawings.

BRIEF DESCRIPTION OF THE DRAWINGS

FIG. 1(a) and FIG. 1(b) are front views of a connector inspecting apparatus according to an embodiment of the present invention, wherein FIG. 1(a) shows a state of the apparatus before inspection, and FIG. 1(b) shows a state of the apparatus at the time of inspection;

FIG. 5(a) and FIG. 5(b) are front views of a connector inspecting apparatus according to another embodiment of the present invention, wherein FIG. 5(a) shows a state of the apparatus before inspection, and FIG. 5(b) shows a state of the apparatus at the time of inspection;

DESCRIPTION OF PREFERRED EMBODIMENTS

Figure 1A:
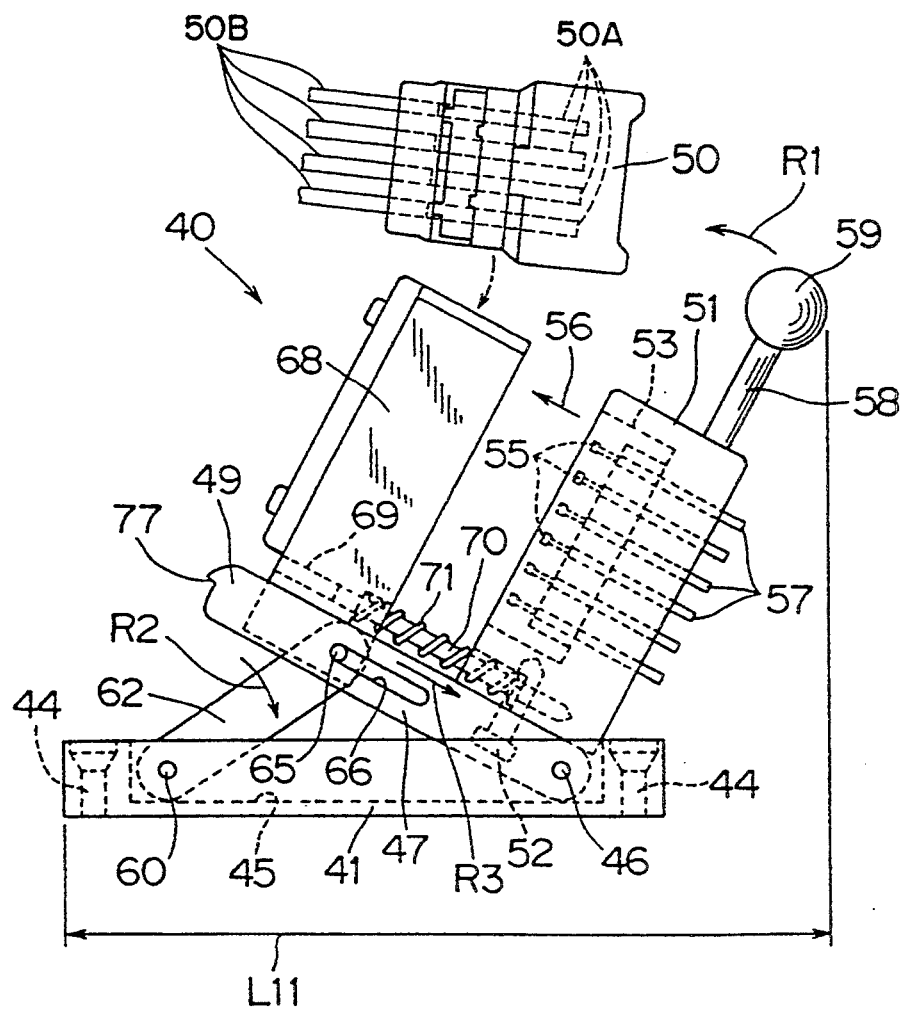
Figure 1B:
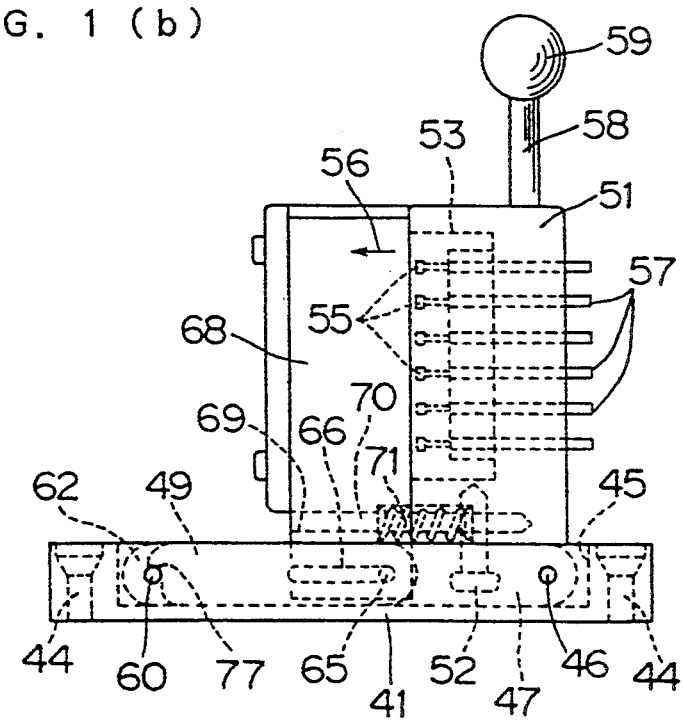
Figure 2:
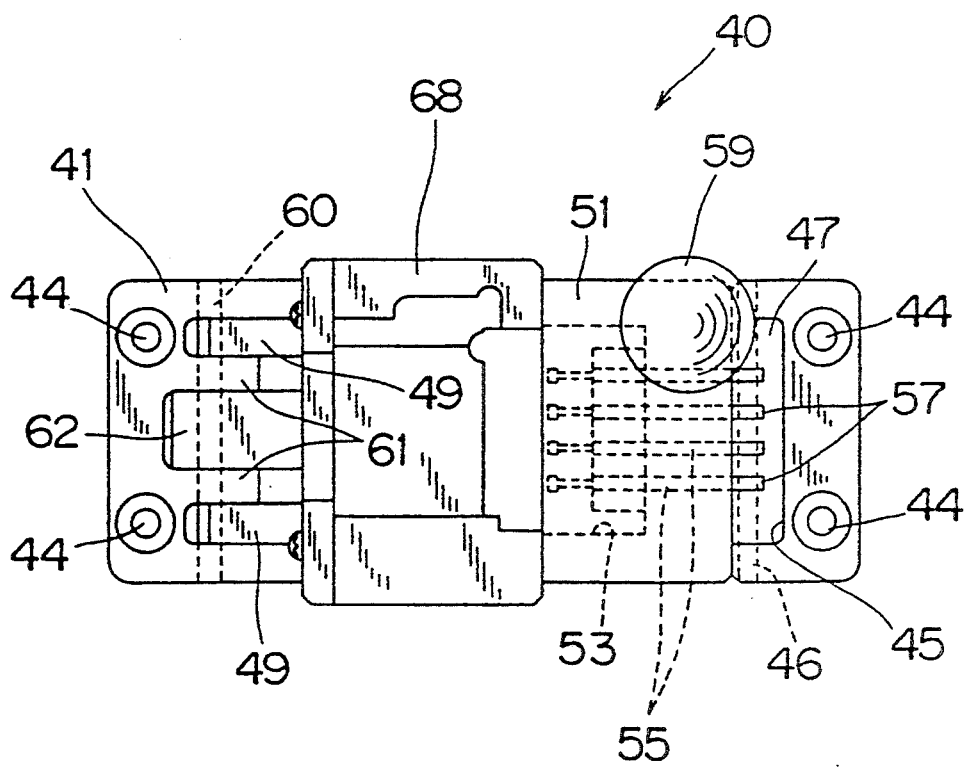
FIG. 2 is a plan view of the connector inspecting apparatus shown in FIG. 1.

FIG. 1(a) and FIG. 1(b) are front views of a connector inspecting apparatus according to an embodiment of the present invention. FIG. 2 is a plan view of the connector inspecting apparatus which is in a state shown in FIG. 1(b). A connector inspecting apparatus 40 in FIGS. 1 and 2 may be used, for example, for inspecting a connector 50 attached to a wire harness. That is, the connector 50 is checked as to whether or not terminals 50A in a housing of the connector 50 are securely mounted on accurate positions, and whether or not electric wires 50B are satisfactorily crimped on the terminals 50A.

Figure 10:
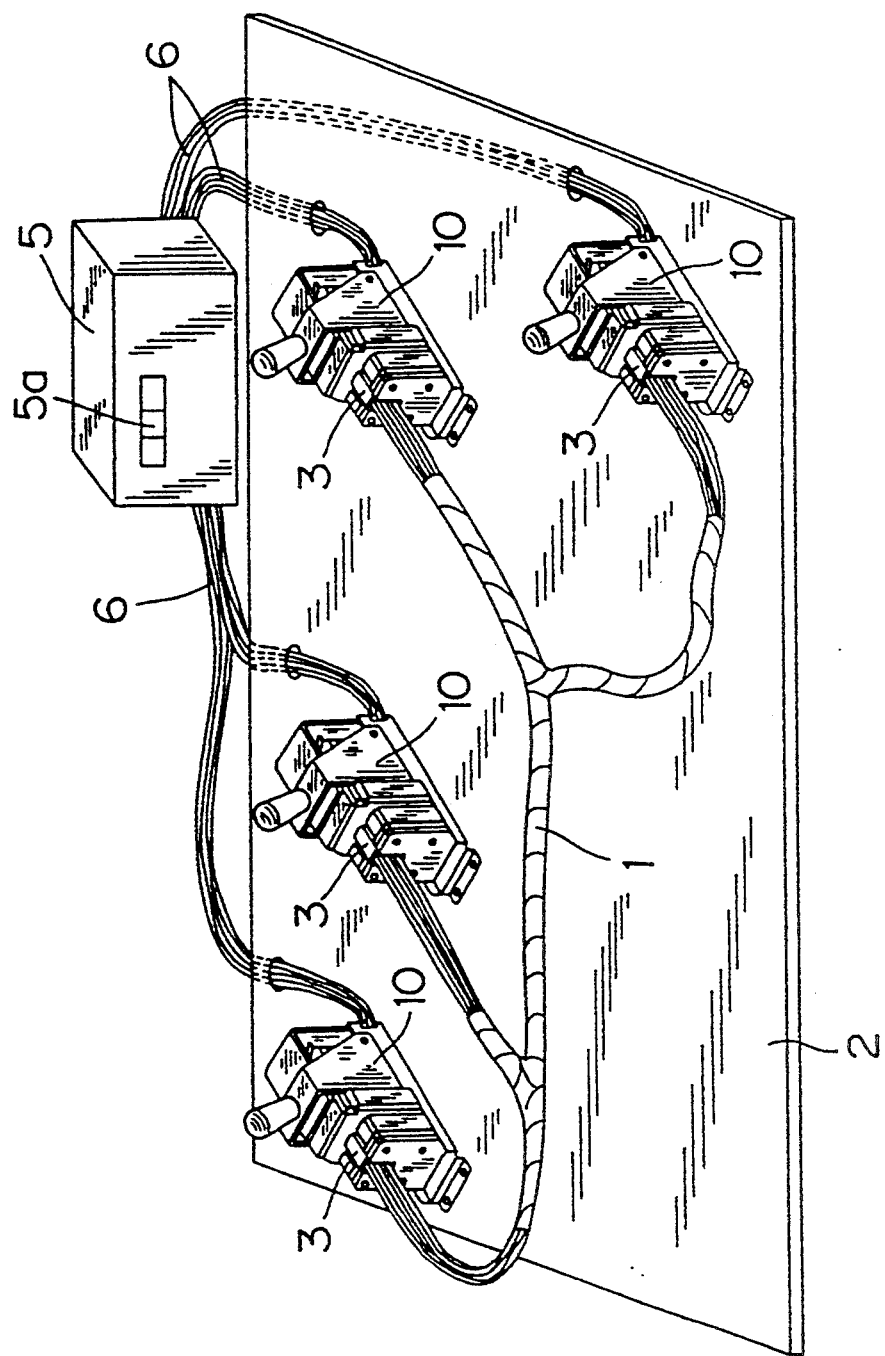
FIG. 10 is a perspective view illustrating how conventional connector inspecting apparatus are used.

Such an inspection is conducted in the following manner. A wire harness is installed in a predetermined mode on an inspection drawing plate as already shown in FIG. 10, and each connector connected to an end of the wire harness, is mounted on each connector inspecting apparatus 40. The connector inspecting apparatus 40 are previously fixed to respective positions at which connectors are to be disposed on the inspection drawing plate.

According to this embodiment, the connector inspecting apparatus 40 has a rectangular base 41 to be installed on an inspection drawing plate. The base 41 has bolt insertion holes 44 and is attached to the inspection drawing plate by bolts (not shown) which pass through the bolt insertion holes 44 and which are threadedly connected to the inspection drawing plate.

The base 41 has a recess 45. Rotatably attached to one end of the base 41 is a shaft 46 which is disposed at a right angle to the longitudinal direction of the base 41 and which is parallel to the inspection drawing plate on which the base 41 is installed. The shaft 46 passes through an end of a holding member 47 shown in FIG. 3. The holding member 47, the shaft 46 and the like form attaching means.

The holding member 47 has a base portion 48 and a pair of arms 49 extending from the base portion 48, and is generally made substantially in the form of a U shape. As shown in FIG. 1(b) and FIG. 2, this holding member 47 has such size and shape as to be housed in the recess 45.

Figure 3:
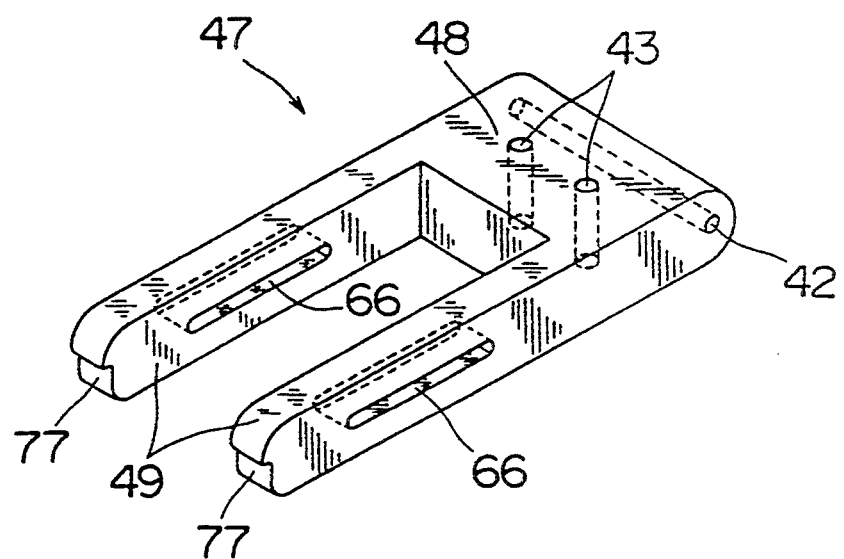
FIG. 3 is a perspective view of a holding member for holding an inspecting portion.

A block-like inspecting portion 51 is fixed to the base portion 48 of the holding member 47 by bolts 52 passing through bolt insertion holes 43 (See FIG. 3). The inspecting portion 51 is provided in the end surface thereof opposite to the shaft 46 with a recess 53. Disposed in this recess 53 are a plurality of detecting pieces 55 which project in a direction parallel with the arms 49. These detecting pieces 55 are disposed side by side and adapted to be electrically connected to the terminals 50A held by the connector 50 to be inspected. Further, these detecting pieces 55 are resiliently biased in a direction shown by an arrow 56 by coil springs (not shown), and electrically connected to terminals 57, respectively, which project from the inspecting portion 51 at its end surface at the side of the shaft 46. The terminals 57 are electrically connected to a conduction inspecting unit (not shown).

Fixed to the top of the inspecting portion 51 is an operating lever 58 extending at a right angle to the holding member 47. A knob 59 is secured to the tip of the operating lever 58.

At the end of the base 41 opposite to the end thereof at which the shaft 4.6 is disposed, there is disposed another shaft 60 which extends at a right angle to the longitudinal direction of the base 41. This shaft 60 passes through the lateral walls of the base 41 and also passes through a pair of bearing portions 61 which project in the recess 45. Between the pair of bearing portions 61, the shaft 60 passes through an end of a link 62.

A shaft 65 passes through the other end of the link 62. This shaft 65 slidably passes through slide holes 66 respectively formed in the pair of arms 49 of the holding member 47. In this embodiment, the link 62, the shafts 60, 65, the holding member 47 and the like form mechanism means.

A connector receiving portion 68 for holding the connector 50 to be inspected, is disposed on the tops of the pair of arms 49 of the holding member 47. A plurality of (for example, three) insertion holes 69 are formed in the bottom of the connector receiving portion 68. A plurality of (for example, three) guide rods 70 serving as guiding means pass through the plurality of insertion holes 69 such that the guide rods 70 project from the bottom of the inspecting portion 51 to the connector receiving portion 68. A coil spring 71 is wound on at least one of the plurality of guide rods 70 such that the connector receiving portion 68 is biased in a direction away from the inspecting portion 51.

Figure 4:
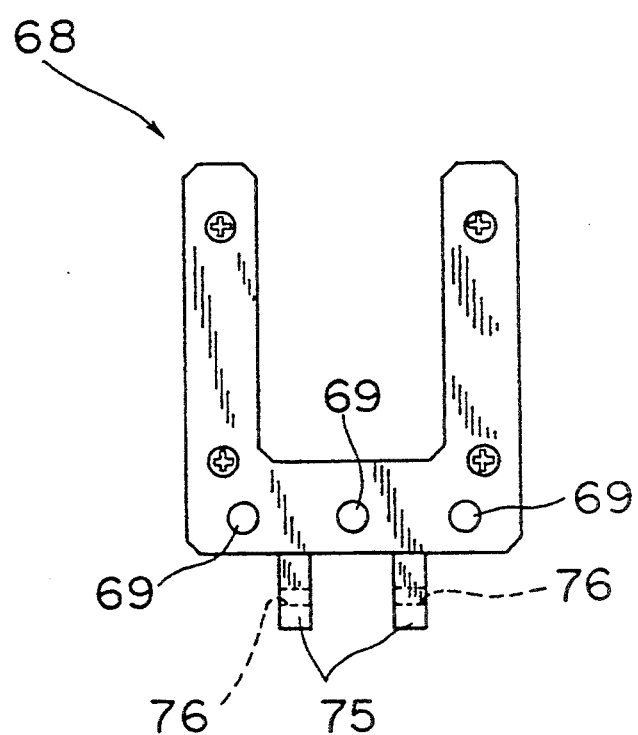
FIG. 4 is a side view of a connector receiving portion.

As shown in a side view of FIG. 4, a pair of attaching members 75 project from the bottom of the connector receiving portion 68. These attaching members 75 are engaged between the pair of arms 49 and come in slide contact therewith. The shaft 65 passes through insertion holes 76 formed in the attaching members 75.

For inspecting the connector 50, an inspection operator sets the connector inspecting apparatus 40 to a state shown in FIG. 1(a), and mounts the connector 50 on the connector receiving portion 68. Then, the inspection operator holds the knob 59 and rotates the lever 58 in a direction shown by an arrow R1. At this time, the inspecting portion 51 and the holding member 47 are rotated, together with the lever 58, around the shaft 46.

With such a rotation, the link 62 is rotated in a direction shown by an arrow R2. This causes the shaft 65 to be slided in the slide holes 66 in a direction shown by an arrow R3. As a result, the connector receiving portion 68 attached to the shaft 65 through the attaching members 75, approaches the inspecting portion 51 against the spring load of the coil spring 71, while the connector receiving portion 68 is guided by the guide rods 70.

Finally, the holding member 47 is perfectly housed in the recess 45 so that the connector inspecting apparatus 40 is brought to a state shown in FIG. 1(b). At this time, engagement indents 77 formed at the tips of the arms 49 of the holding member 47, engage with the shaft 60, so that the state shown in FIG. 1(b) is maintained. More specifically, the connector receiving portion 68 and the inspecting portion 51 are respectively maintained at positions where the terminals 50A of the connector 50 are in contact with the detecting pieces 55.

In the state in FIG. 1(b), the respective tips of the terminals 50A of the connector 50 are in contact with the respective detecting pieces 55, and the detecting pieces 55 are slightly pushed into the inspecting portion 51. At this time, by the resilient force of the coil springs (not shown), a contact pressure is generated between the terminals 50A and the detecting pieces 55, thus providing electric conduction therebetween.

In the manner above-mentioned, the inspection of the connector 50 is achieved. If the terminals 50A cannot be electrically connected to the detecting pieces 55, or if the relation of electric connection therebetween, is different from a predetermined one, it is then judged as abnormal.

In the connector inspecting apparatus 40 having the arrangement above-mentioned, when the holding member 47 and the inspecting portion 51 are rotated around the shaft 46 parallel with the inspection drawing plate on which the base 41 is installed, such a rotational movement is converted into a sliding movement of the connector receiving portion 68 along the pair of arms 49 of the holding member 47. Accordingly, the connector receiving portion 68 can be moved toward/away from the inspecting portion 51.

Figure 11:
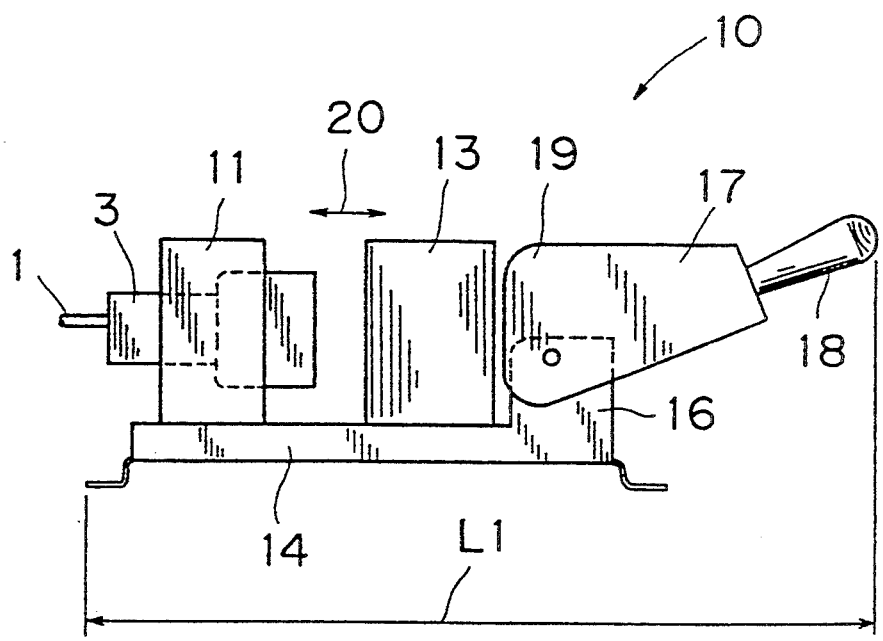
FIG. 11 is a schematic front view of the conventional connector inspecting apparatus shown in FIG. 9.
Figure 12:
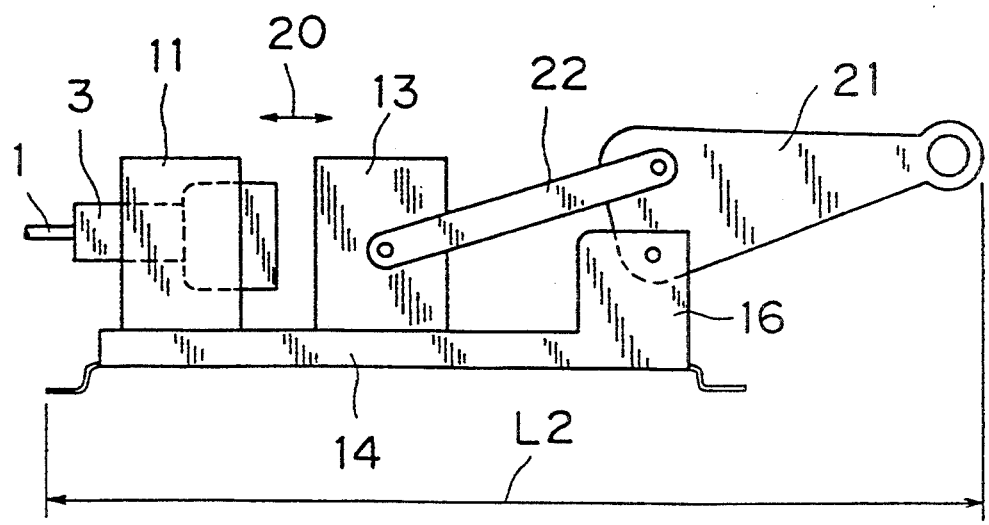
FIG. 12 is a front view schematically illustrating the arrangement of another conventional connector inspecting apparatus.

Unlike the conventional apparatus using a cam-type or link-type drive mechanism shown in FIGS. 11 or 12, the inspecting apparatus 40 having the arrangement above-mentioned requires a small installation space having a length L11 which is slightly longer than the length of the base 41. As a result, with a small space, the connector 50 can be inspected on the inspection drawing plate on which the wire harness is disposed in a complicated mode.

Figure 13:
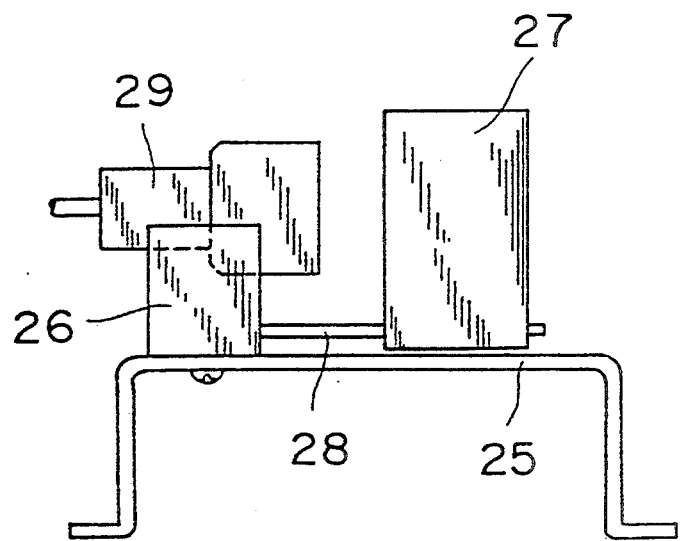
FIG. 13 is a front view schematically illustrating the arrangement of a further conventional connector inspecting apparatus.
Figure 14:
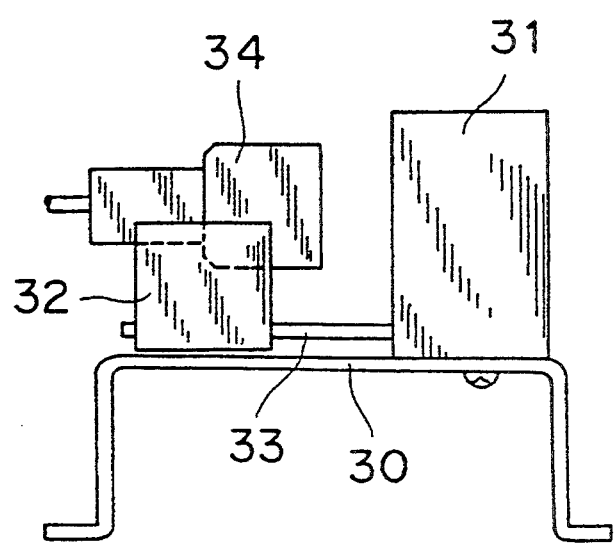
FIG. 14 is a front view schematically illustrating the arrangement of still another conventional connector inspecting apparatus.

Unlike the conventional apparatus in FIG. 13 or 14, the connector inspecting apparatus 40 of this embodiment is not arranged such that the inspecting portion or the connector receiving portion is slided as held directly by fingers of an inspection operator. More specifically, the lever 58 is operated to rotate the inspecting portion 51 and the like, and such a rotational movement is converted into a sliding movement of the connector receiving portion 68. Accordingly, the connector inspecting apparatus 40 of this embodiment requires no great force at the time of inspection, thus enabling the inspection to be readily made.

Instead of operating the lever 58, the connector receiving portion 68 may be pushed down to rotate the holding member 47 around the shaft 46, so that the connector receiving portion 68 can be slided toward the inspecting portion 51. Accordingly, when pushing the connector 50 into the connector receiving portion 68, the connector receiving portion 68 may also be pushed down. Thus, the operation of bringing the connector receiving portion 68 close to the inspecting portion 51 can be subsequently carried out after the operation of mounting the connector 50. This improves the inspection efficiency.

It is a matter of course that the embodiment above-mentioned may be modified such that the connector receiving portion 68 and the inspecting portion 51 are replaced with each other so that the connector receiving portion 68 is fixed to the holding member 47 while the inspecting portion 51 is slidable.

Figure 5A:
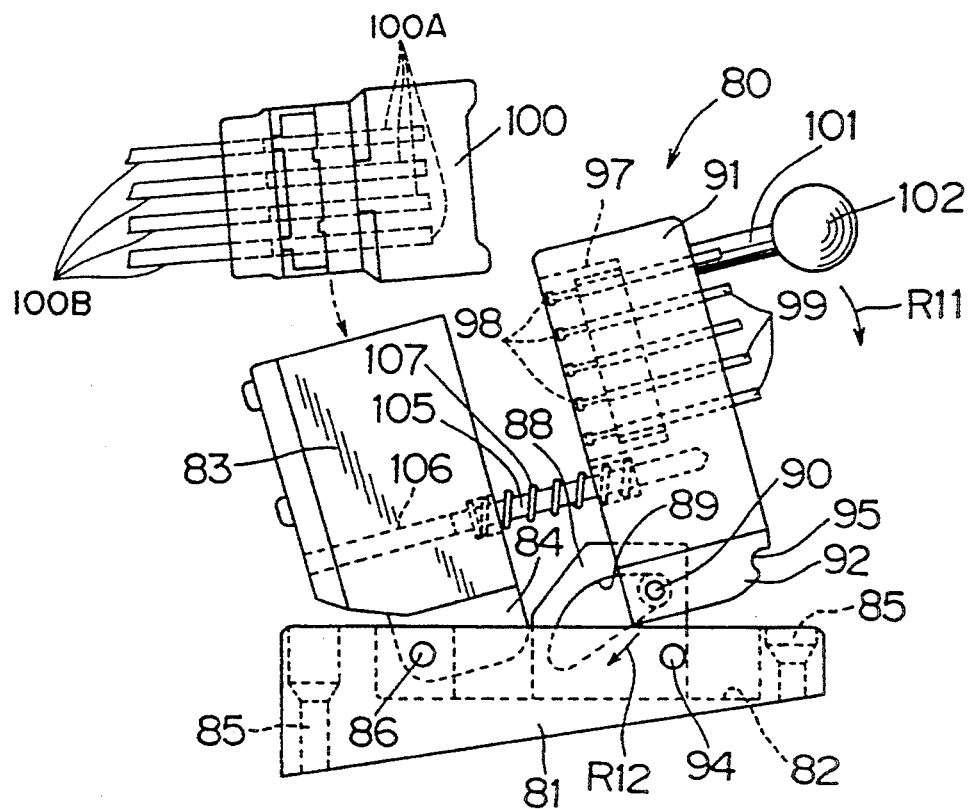
Figure 5B:
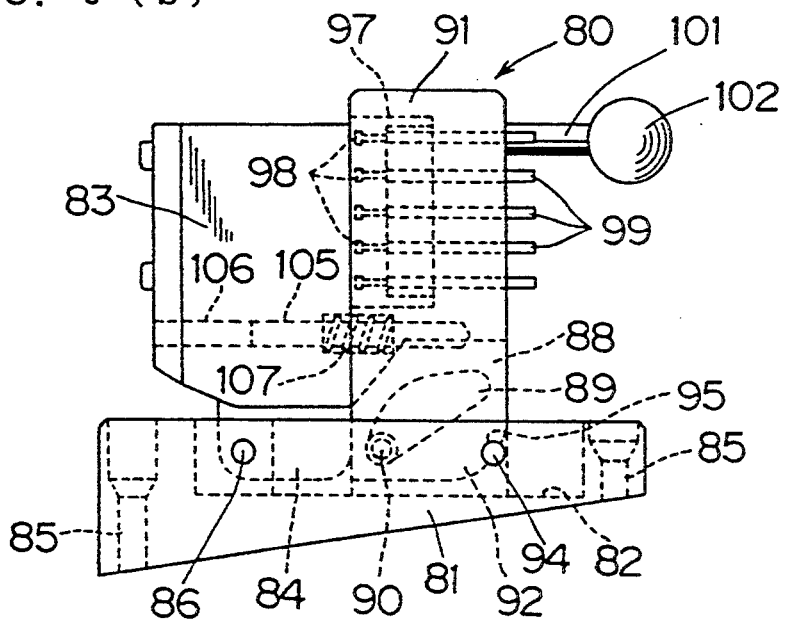
Figure 6:
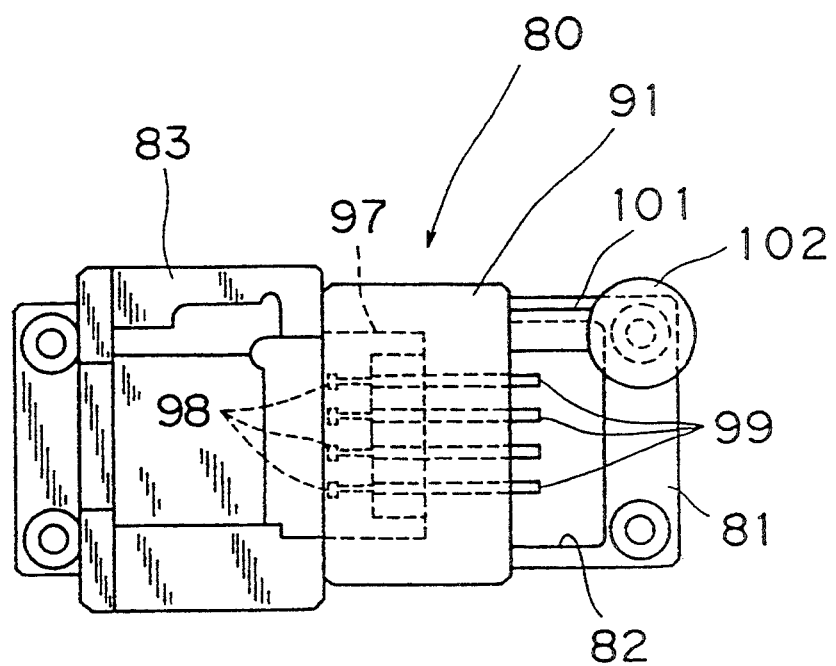
FIG. 6 is a plan view of the connector inspecting apparatus shown in FIG. 5.

FIG. 5(a) and FIG. 5(b) are front views of a connector inspecting apparatus 80 according to another embodiment of the present invention. FIG. 6 is a plan view of the connector inspecting apparatus which is in a state shown in FIG. 5(b). The connector inspecting apparatus 80 has a base 81 of which bottom surface is inclined. This base 81 is provided in the top thereof with a recess 82. Attaching members 84 projecting from the bottom surface of a connector receiving portion 83, are fitted in the recess 82. The reference numeral 85 designates bolt insertion holes.

A shaft 86 passing through the lateral walls of the base 81, passes through the attaching members 84. Thus, the connector receiving portion 83 is so attached to the base 81 as to be rotatable around the shaft 86. The attaching members 84, the shaft 86 and the like form attaching means.

Figure 7:
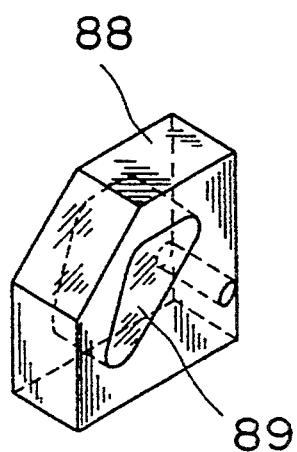
FIG. 7 is a perspective view of an inspecting portion holding member.

An inspecting portion holding member 88 shown in FIG. 7 is fixed in the recess 82 at its position opposite to the connector receiving portion 83. Formed in the inspecting portion holding member 88 is a slide hole 89 inclinedly extending toward the top of the base 81. A shaft 90 passes through the slide hole 89.

Figure 8:
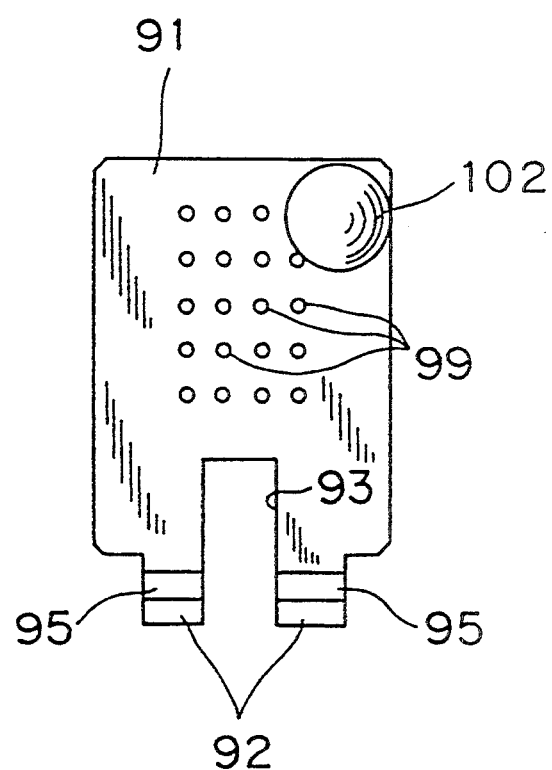
FIG. 8 is a side view of an inspecting portion.
Figure 9:
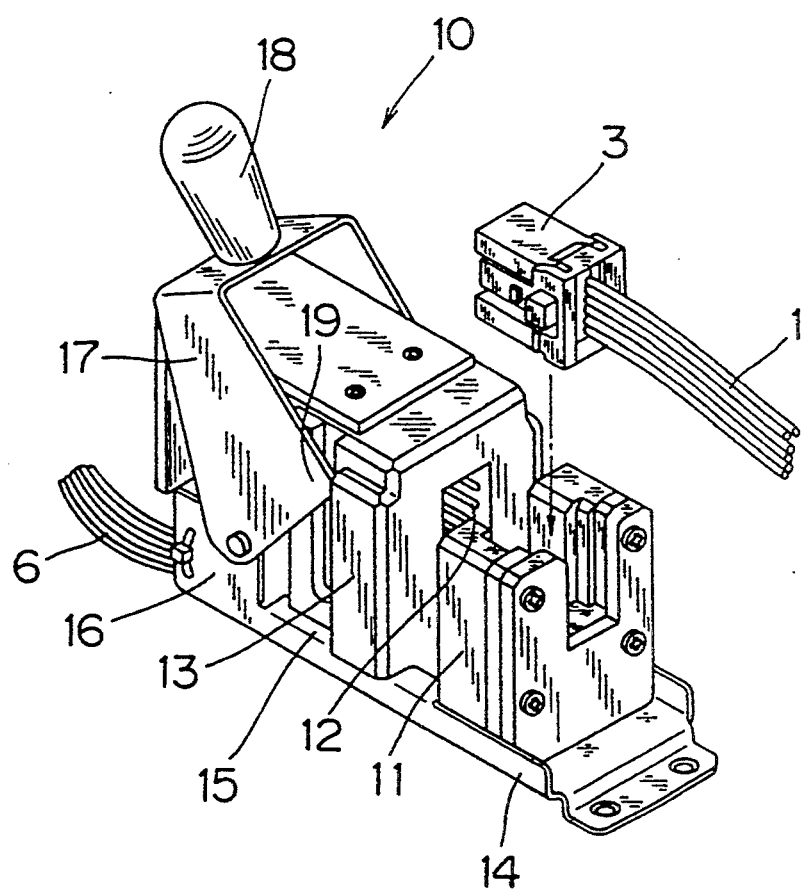
FIG. 9 is a perspective view of a conventional connector inspecting apparatus.

The shaft 90 also passes through a pair of attaching members 92 projecting from the bottom surface of an inspecting portion 91 of which side view is shown in FIG. 8. Formed between the attaching members 92 is a groove 93 in which the inspecting portion holding member 88 is fitted. Accordingly, the shaft 90 can slide together with the inspecting portion 91 along the slide hole 89. With the arrangement above-mentioned, the inspecting portion 91 can be rotated along a plane at a right angle to the shaft 86 and can be moved toward/away from the connector receiving portion 83. In this embodiment, the inspecting portion holding member 88, the shaft 90 and the like form mechanism means.

Formed at the rear ends of the attaching members 92 are engagement indents 95 with which the inspecting portion 91 is adapted to be engaged. The engagement indents 95 are engaged with a shaft 94 when the inspecting portion 91 is slided to a terminal position (See FIG. 5(b)). The shaft 94 is fixed as passing through the lateral walls of the base 81 and through the inspecting portion holding member 88.

A recess 97 is formed in the inspecting portion 91 at the end thereof opposite to the connector receiving portion 83. Disposed side by side in the recess 97 are a plurality of detecting pieces 98 which correspond to terminals 100A held in a connector 100 to be inspected. The plurality of detecting pieces 98 are electrically connected to a plurality of terminals 99, respectively, projecting from the rear end surface of the inspecting portion 91. These terminals 99 are electrically connected to a conduction inspecting unit (not shown).

An operating lever 101 is fixed to the rear end surface of the inspecting portion 91, and a knob 102 is secured to the tip of the lever 101. Fixed to the bottom of the inspecting portion 91 are guide rods 105 serving as guide means and projecting toward the connector receiving portion 83. The guide rods 105 pass through insertion holes 106 formed in the bottom of the connector receiving portion 83. Disposed between the connector receiving portion 83 and the inspecting portion 91 is a coil spring 107 adapted such that the connector receiving portion 83 and the inspecting portion 91 are biased in a direction away from each other.

For inspection, an inspection operator mounts the connector 100 on the connector receiving portion 83, and pushes the lever 101 down in a direction shown by an arrow R11 with the knob 102 held. At this time, the shaft 90 is guided to the bottom surface of the slide hole 89 and slided in a direction shown by an arrow R12. Accordingly, the inspecting portion 91 attached to the shaft 90 through the attaching members 92 is guided by the guide rods 105 and approaches to the connector receiving portion 83 while compressing the coil spring 107.

In the manner above-mentioned, the connector inspecting apparatus 80 is brought to a state shown in FIG. 5(b) where the terminals 100A held by the connector 100 mounted on the connector receiving portion 83, are electrically connected to the detecting pieces 98 of the inspecting portion 91. Then, the indents 95 of the attaching members 92 projecting from the bottom of the inspecting portion 91, are engaged with the shaft 94. Accordingly, even after the inspection operator releases his or her hand from the lever 101, the state shown in FIG. 5(b) is maintained. Accordingly, the connector receiving portion 83 and the inspecting portion 91 are respectively held at positions where the terminals 100A of the connector 100 are in contact with the detecting pieces 98.

According to the embodiment above-mentioned, too, the rotation of the connector receiving portion 83 around the shaft 86 parallel to the inspection drawing plate, is converted into a sliding movement of the inspecting portion 91 with respect to the connector receiving portion 83. Accordingly, the connector inspecting apparatus 80 of this embodiment does not require a great installation space, but it is enough to provide an installation space of which the length is slightly longer than the length of the base 81.

Instead of the lever 101 projecting from the rear end surface of the inspecting portion 91, a lever may be disposed as projecting upward from the top of the inspecting portion 91. In such a case, since the lever does not project as exceeding the installation space of the base 81, the installation space of the connector inspecting apparatus 80 can be further reduced.

Further, the connector inspecting apparatus 80 of this embodiment is not arranged such that the connector receiving portion 83 or the inspecting portion 91 is directly slided, but the rotational movement of the connector receiving portion 83 and the like is converted into a sliding movement of the inspecting portion 91. Accordingly, a great force is not required at the time of inspection, thus enabling the connector 100 to be inspected with good efficiency.

According to this embodiment, too, the connector receiving portion 83 and the inspecting portion 91 may be replaced with each other, likewise in the embodiment mentioned earlier. More specifically, provision may be made such that the inspecting portion 91 is rotatably attached to the base 81 and the connector receiving portion 83 is movable toward/away from the inspecting portion 91.

The detailed description has been made of the embodiments of the present invention. However, these embodiments are to be considered merely as specific examples for clarifying the technical contents of the present invention. Accordingly, the present invention should not be limited to these specific examples and should not be construed in a narrow sense. The spirit and scope of the present invention are indicated only by the description of the appended claims.

What is claimed is:

1. A connector inspecting apparatus comprising:
   a base;
   a connector receiving portion for holding a connector to be inspected, which connector has a terminal;
   an inspecting portion disposed opposite to said connector receiving portion and having a detecting piece corresponding to the terminal of the connector to inspected, said detecting piece projecting toward said connector receiving portion;
   attaching means for attaching, to said base, said connector receiving portion and said inspecting portion in a manner rotatable around a predetermined axis;
   guide means for guiding said connector receiving portion such that said connector receiving portion is movable toward and away from said inspecting portion; and
   mechanism means for converting rotational movement of said connector receiving portion and said inspecting portion, around said predetermined axis, sliding movement of said connector receiving portion, whereby said connector receiving portion as guided by said guide means, slides in a direction for engaging with said inspecting portion.

2. A connector inspecting apparatus according to claim 1, wherein said inspecting portion has an operating lever for rotating said connector receiving portion and said inspecting portion around said predetermined axis.

3. A connector inspecting apparatus according to claim 1, wherein detection of whether or not the terminal of the connector is properly mounted is based on whether or not the terminal and the detecting piece are electrically connected to each other when said connector receiving portion and said inspecting portion are engaged with each other.

4. A connector inspecting apparatus according to claim 1, further comprising means for maintaining said connector receiving portion and said inspecting portion at predetermined positions wherein the terminal of the connector is in contact with the detecting piece.

5. A connector inspecting apparatus comprising:
   a base;
   a connector receiving portion for holding a connector to be inspected, said connector having a terminal;
   an inspecting portion disposed opposite to said connector receiving portion and having a detecting piece corresponding to the terminal of the connector to be inspected, said detecting piece projecting toward said connector receiving portion;
   a holding member for holding said connector receiving portion and said inspecting portion, said holding member being attached to said base in a manner rotatable around a predetermined first axis;
   guide means for guiding said connector receiving portion such that said connector receiving portion is movable toward and away from from said inspecting portion;
   a link having two ends with one end attached to said base in a manner rotatable around a predetermined second axis parallel with said first axis, and the other end slidably engaged with said holding member; and
   means for attaching said other end of said link to said connector receiving portion.

6. A connector inspecting apparatus according to claim 5, wherein said inspecting portion has an operating lever for rotating said holding member around said first axis.

7. A connector inspecting apparatus according to claim 5, wherein detection of whether or not the terminal of the connector is properly mounted is based on whether or not the terminal and the detecting piece are electrically connected to each other when said connector receiving portion and said inspecting portion are engaged with each other.

8. A connector inspecting apparatus according to claim 5, further comprising means for maintaining said connector receiving portion and said inspecting portion at predetermined positions wherein the terminal of the connector is in contact with the detecting piece.

* * * * *